United States Patent [19]
Pollock et al.

[11] Patent Number: 5,388,027
[45] Date of Patent: Feb. 7, 1995

[54] ELECTRONIC CIRCUIT ASSEMBLY WITH IMPROVED HEATSINKING

[75] Inventors: Randy L. Pollock, Austin, Tex.; George F. Anderson, Jr., Cave Creek, Ariz.

[73] Assignee: Motorola, Inc., Schaumburg, Ill.

[21] Appl. No.: 99,670

[22] Filed: Jul. 29, 1993

[51] Int. Cl.6 .............................................. H05K 7/20
[52] U.S. Cl. ..................... 361/705; 165/185; 257/711; 361/713; 361/762
[58] Field of Search ............. 428/209, 614, 901; 174/16.3, 252; 257/706, 707, 711, 714; 165/80.3, 185; 361/704, 705, 707, 708, 713, 718, 719, 761, 762, 764

[56] References Cited
U.S. PATENT DOCUMENTS

| | | | |
|---|---|---|---|
| 3,716,759 | 2/1973 | Scace | 361/707 |
| 3,739,232 | 6/1973 | Grossman | 361/762 |
| 3,949,263 | 4/1976 | Harper | 165/185 |
| 4,425,195 | 1/1984 | Papanicolaou | 204/3 |
| 4,582,954 | 4/1986 | Eaton | 174/16.3 |
| 4,689,583 | 8/1987 | Jerinic et al. | |
| 4,698,901 | 10/1987 | Davies et al. | |
| 4,999,740 | 3/1991 | Ilardi | 361/762 |
| 5,012,386 | 4/1991 | McShane | 361/762 |
| 5,045,972 | 9/1991 | Supan et al. | |
| 5,109,268 | 4/1992 | Butera | 357/74 |
| 5,120,495 | 6/1992 | Supan et al. | |
| 5,124,179 | 6/1992 | Garg et al. | |
| 5,126,206 | 6/1992 | Garg et al. | |
| 5,128,006 | 7/1992 | Mitchell et al. | |

OTHER PUBLICATIONS

"Electrical—Chips", #28847, Research Disclosure Apr. 1988, p. 1 (361–705).
Cheap Diamond Films: Expect Mechanical, Optical, and Electronics Applications, High-Tech Materials Alert, Jun. 1987, pp. 5–8.
Chementator, Chemical Engineering, Nov. 1992, p. 25.
Inside R&D, Nov. 4, 1992, p. 7.
D. J. Pickrell et al., Chemical Vapor Deposition of Diamond for Electronic Packaging Applications. Inside ISHM, Jul./Aug. 1991, pp. 11–15.
J. L. Davidson et al., Selective Deposition of Diamond Films, Journal of Electronic Materials, vol. 18, No. 6, 1989, pp. 711–715.
Science and Business, Scientific American, Aug. 1989, pp. 60–62.
A. B. Harker, Diamond Films: Hard Materials to Beat, R&D Magazine, Mar. 1990, pp. 84–92.

Primary Examiner—Gerald P. Tolin
Attorney, Agent, or Firm—Aaron B. Bernstein

[57] ABSTRACT

An electronic circuit assembly with improved heatsinking is provided. The assembly includes a component carrying board (56) which has an opening (62) through it. The opening is sized to receive a heat generating electronic component (64). A diamond layer (50) is attached as a heat sink to the bottom (58) of the component carrying board. The heat generating component (64) is attached directly to the diamond layer (50), through the opening (62) in the component carrying board (56). The diamond layer provides electrical insulation as well as superior heat dissipation.

13 Claims, 2 Drawing Sheets

ELECTRONIC CIRCUIT ASSEMBLY WITH IMPROVED HEATSINKING

BACKGROUND OF THE INVENTION

The present invention relates, in general, to electronic circuit assemblies, and more particularly to electronic circuit assemblies having improved heatsinking capabilities.

Modern electronic circuit assemblies include high power analog and digital semiconductor devices which inherently generate a great deal of heat. The heat generated by the components must be dissipated during operation in order to maintain acceptable operation temperatures.

Conventionally, electronic components are mounted on printed circuit boards. Printed circuit boards are not good heatsinks, but provide the electrical insulation necessary for electronic circuit operation, and provide a substrate for printed circuits connecting the various components. In order to dissipate heat, the conventional printed circuit boards are typically mounted on metal, e.g. copper, heatsinks which will draw the heat from the circuit board.

In analog electronics, as frequencies and power increase as required by modern telecommunications for example, the above described heatsinking arrangement is not sufficient to maintain operable temperatures. The same problem arises in digital electronics for example with high performance microprocessors. A prior art solution is to isolate the particular components generating the most heat, and attach them separately to the metal heatsink which lies below the printed circuit board. This is accomplished by providing an opening through the printed circuit board, the opening accessing the metal heatsink.

The heat generating component can not be attached directly to the metal heatsink because it must be attached to an electrically insulating substrate. Consequently, the heat generating component is first attached to a ceramic substrate. The ceramic substrate is then attached to the metal heatsink, through the opening in the printed circuit board.

The prior art solution gives rise to particular disadvantages. For example, the ceramic substrate between the heat generating component and the heatsink does not dissipate heat particularly well. Ceramics have approximately 1/100 the heat dissipation ability compared to copper. Consequently, although operable temperatures can be maintained, there will be localized heat gradients, the heat being high near the heat generating component mounted on the ceramic substrate. This leads to problems such as metal migration, which eventually results in device failure.

Additionally, beryllium oxide is typically used as the ceramic substrate because it has fairly good heat dissipating characteristics. However, beryllium oxide gives rise to toxic substances during processing. Furthermore, since the ceramic connecting the heat generating component through the heatsink is not a particularly good heat dissipater, the electronic component itself must be designed to dissipate heat as efficiently as possible. Typically, the electronic component is a semiconductor die. In order to provide efficient heat dissipation, the semiconductor die is often thinned to as little as 5 mils. The thinning leads to a more fragile device and requires extra processing, and therefore negatively impacts cost and yield.

What is needed is an electronic circuit assembly with improved heatsinking which overcomes the disadvantages of the prior art. Specifically, a heatsinking arrangement is needed which conducts heat efficiently and uniformly, while providing electrical insulation without the need for an extra ceramic substrate. Additionally, it would be desirable to provide enough heat dissipation so that the heat generating component does not need to be thinned.

SUMMARY OF THE INVENTION

Briefly stated, the present invention overcomes the disadvantages of the prior art by providing an electronic circuit assembly with improved heatsinking capabilities. Generally, the assembly comprises a component carrying board, such as a printed circuit board, comprising a top surface and a bottom surface and at least one opening extending through the board. The opening is sized to receive an electronic component such as the heat generating component. A diamond layer is disposed adjacent the bottom surface of the component carrying board. The diamond layer insulatingly contacts the electronic component through the opening in the component carrying board. Consequently, heat is dissipated from the electronic component to the diamond layer, and distributed relatively uniformly throughout the diamond layer.

The term "diamond", as used to describe materials associated with the invention, is intended to mean substantially diamond.

DETAILED DESCRIPTION OF THE DRAWINGS

Figure 1:
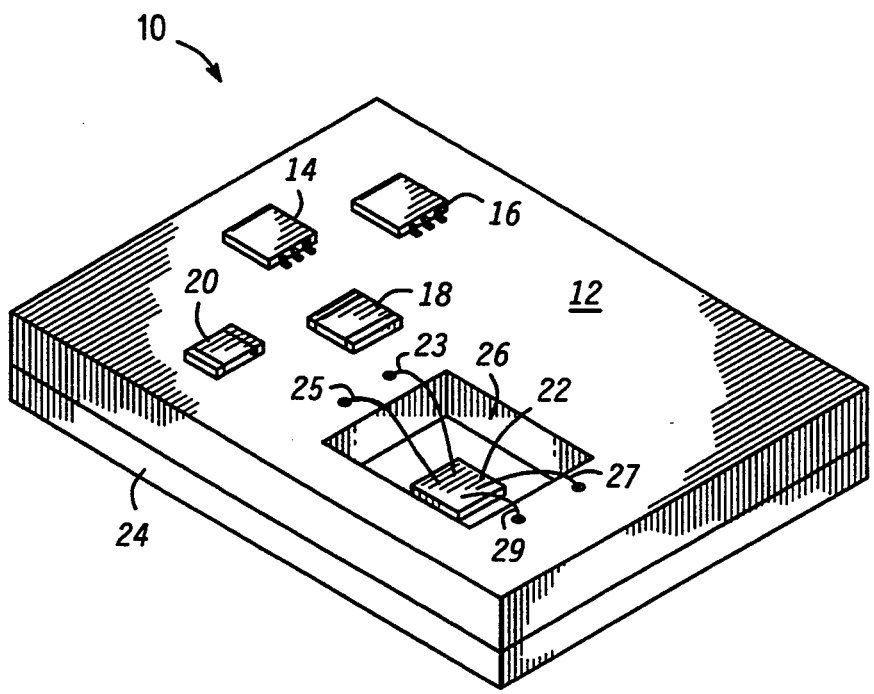
FIG. 1 is a perspective view of a simplified exemplary electronic circuit assembly.

FIG. 1 is a perspective view of electronic circuit assembly 10. Circuit assembly 10 is a simplified exemplary assembly. Circuit assembly 10 includes component carrying board 12, which is typically a printed circuit board comprising an insulating board and conductive traces connecting the various components (not shown). Components 14, 16, 18, 20 and 22 represent the electronic components comprising the circuit. Components 14 and 16 represent surface mount integrated circuits. Components 18 and 20 represent chip resistors and chip capacitors. Component 22 is the heat generating component. Heat generating component 22 may be a high frequency analog device or a microprocessor, for example. Note that wires 23, 25, 27 and 29 represent wirebonded connections between component 22 and the rest of the circuit. Alternatively, component 22 could be a packaged device electrically connected to the rest of the circuit with patterned traces.

Circuit assembly 10 further includes heatsinking layer 24 disposed on the bottom surface of printed circuit board 12. In the prior art, heatsinking layer 24 would comprise a copper substrate. Additionally, heat generating component 22 would be mounted to a ceramic substrate (not shown), and attached to heatsinking layer 24 through opening 26 in printed circuit board 12. Opening 26 is sized to receive component 22.

In contrast, in accordance with the present invention, heatsinking layer 24 comprises a diamond layer. Additionally, heat generating component 22 is mounted directly to diamond layer 24. Both the prior art approach and the assembly in accordance with the present invention are discussed in further detail below.

Figure 2:
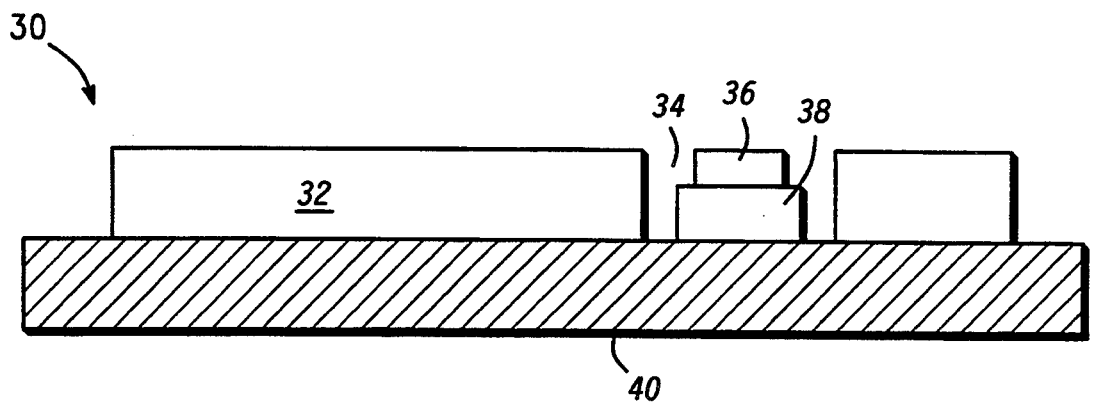
FIG. 2 is a simplified cross-section of an electronic circuit assembly of the prior art.

FIG. 2 is a highly simplified cross-section of a prior art circuit assembly 30. Circuit assembly 30 comprises component carrying board 32, which is typically a printed circuit board. Printed circuit board 32 comprises opening 34. Opening 34 is sized to receive electronic component 36 which is attached to ceramic substrate 38. Typically, electronic component 36 comprises a semiconductor die and ceramic substrate 38 comprises a beryllium oxide substrate. Both board 32 and ceramic substrate 38 are attached to metal heatsink 40. Metal heatsink 40 typically comprises a copper substrate. In practice, circuit assembly 30, with copper substrate 40, would be mounted in a piece of electronic equipment such as a computer or portable telephone. Copper layer 40 would typically be screwed to a back plane to further distribute the heat away from the electronic circuit.

Figure 3:
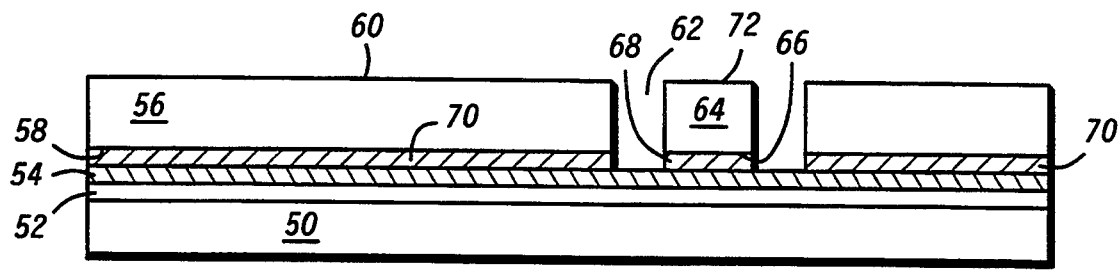
FIG. 3 is a simplified cross-section of an electronic circuit assembly in accordance with the present invention.
Figure 4:
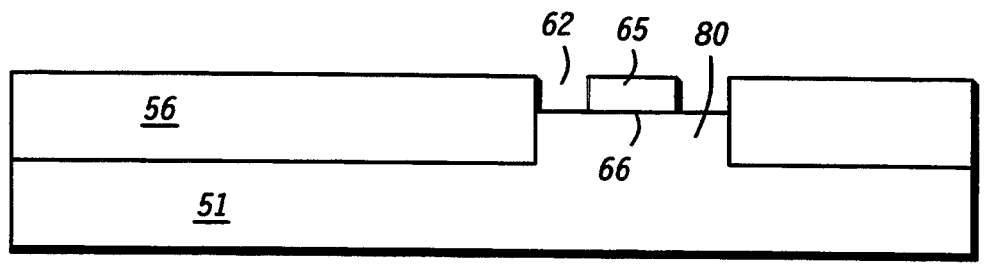
FIG. 4 is a simplified cross-section of an alternate embodiment of an electronic circuit assembly in accordance with the present invention.
Figure 5:
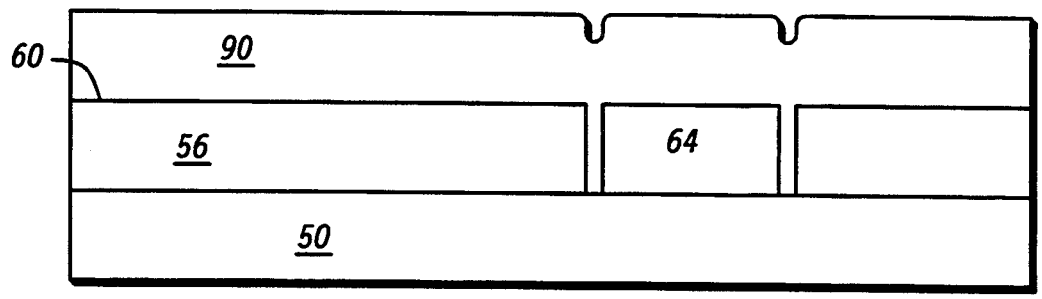
FIG. 5 is a simplified cross-section of yet another embodiment of an electronic circuit assembly in accordance with the present invention.

FIG. 3 is a highly simplified cross-section of a electronic circuit assembly in accordance with the present invention. FIG. 3 represents the preferred assembly, while FIGS. 4 and 5 represent alternative assemblies in accordance with the present invention. Referring to FIG. 3, a first diamond layer 50 is provided. Diamond layer 50 is preferably a polycrystalline diamond slab, 10-30 mils in thickness. Diamond layer 50 is formed with a commercial chemical vapor deposition (CVD) process and available from Diamonex TM Inc. Diamond layer 50 may alternatively comprise amorphous diamond or single crystalline diamond. In alternative embodiments, detailed below, diamond layer 50 may also comprise deposited thin film.

In the preferred embodiment, diamond layer 50 is sputter deposited with a metal layer capable of interacting with carbon. The preferred metal is tungsten. Referring to FIG. 3, when tungsten is sputtered on diamond layer 50, a tungsten carbide layer 52 forms beneath a tungsten layer 54. Tungsten layer 54 provides a surface which will adhere to solder, for connecting the remainder of the circuit assembly, as will be described. It will be understood that other metals capable of forming metal carbon compounds may be substituted for the sputtered tungsten. In the preferred embodiment, approximately 1,000-5,000 angstroms of tungsten is deposited.

The preferred circuit assembly further comprises component carrying board 56. Component carrying board 56 is a printed circuit board. Board 56 comprises a first surface which is bottom surface 58. Bottom surface 58 opposes a second surface which is top surface 60. Board 56 further comprises opening 62 extending from top surface 60 to bottom surface 58. Opening 62 is sized to receive electronic component 64 which, in the preferred embodiment, comprises a semiconductor die. It will be understood that board 56 may comprise several of such openings as required by other heat generating electronic components.

In the preferred embodiment, semiconductor die 64 attaches to diamond layer 50 through opening 62. More specifically, semiconductor die 64 has a bottom surface 66 which is attached to layer 50 with a first material layer 68 comprising a first solder. Since diamond layer 50 has been covered with tungsten layer 54, layer 68 will adhere to diamond layer 50 by way of tungsten layer 54.

Similarly, bottom surface 58 of board 56 is covered with a second material layer 70, comprising a second solder.

In a preferred method for forming a circuit assembly in accordance with the present invention, semiconductor die 64 is attached to diamond layer 50 before board 56 is attached to diamond layer 50. More specifically, semiconductor die 64 is attached to diamond layer 50 in a location corresponding to opening 62 in board 56. Solder layer 68 is heated to an appropriate temperature to provide reflow and thus attach semiconductor die 64 to diamond layer 50. Subsequently, board 56 is mated to diamond layer 50 in a like manner. Opening 62 surrounds semiconductor die 64.

In the preferred embodiment, first solder layer 68 covering the bottom surface of semiconductor die 64 comprises tin antimony. Tin antimony has a relatively high reflow temperature. In contrast, second solder layer 70 covering bottom surface 58 of board 56 comprises a lower temperature solder, such as tin lead. In a method for producing a circuit assembly in accordance with the present invention, semiconductor die 64 is attached first by reflowing at its solder's higher temperature. Subsequently, board 56 can be attached by reflowing at a lower temperature. The difference in solder fellow temperature therefore permits semiconductor die 64 to remain aligned and undisturbed when board 56 is attached to diamond layer 50.

In the preferred embodiment, semiconductor die 64 is approximately 15-20 mils thick. This thickness is intended to be the thickness of the die after it has been fabricated. Because diamond layer 50 provides such an efficient heatsink, semiconductor die 64 does not need to be thinned, as required by the prior art. Thus, processing steps are eliminated, and yield is improved.

Preferably, board 56 is constructed to be approximately the same thickness as semiconductor die 64. Consequently, top surface 72 of semiconductor die 64 is level with top surface 60 of board 56. Furthermore, bottom surface 66 of semiconductor die 64 is level with bottom surface 58 of board 56. Bottom surface 66 of semiconductor die 64 thus lies in a plane defined by bottom surface 58 of board 56. Because semiconductor die 64 does not need to be thinned and is the same thickness as board 56, processing is significantly simplified. Furthermore, the need for an extra ceramic substrate, with associated costs and extra processing, is eliminated.

An alternative embodiment is illustrated by FIG. 4. FIG. 4 is a simplified cross-section of a circuit assembly in accordance with the present invention. The same reference numerals designate analogous portions of the electronic circuit assembly. The embodiment shown in FIG. 4 permits the use of prethinned die, and therefore may use die which were designed for use with the extra ceramic substrate of the prior art.

One notable difference between the embodiment of FIG. 4 and the embodiment of FIG. 3 is that, in the embodiment of FIG. 4, diamond layer 51 further comprises a first portion 80 extending into opening 62. First portion 80 insulatingly contacts bottom surface 66 of semiconductor die 65. Diamond layer 51 may be provided and prepared with a metal carbon compound and metal layer for adhering to solder from the bottom of board 56 and semiconductor die 64, as described earlier. Alternatively, in the present embodiment, diamond layer 51 may be deposited amorphous or polycrystalline diamond. Acceptable methods of chemical deposition of diamond are disclosed, for example, in U.S. Pat. Nos. 5,124,179 and 5,126,206, which are incorporated herein by reference.

FIG. 5 illustrates another alternative embodiment in accordance with the present invention. FIG. 5 is a simplified cross-section of a circuit assembly comprising elements analogous to those of the embodiment shown in FIG. 3. A notable difference in the embodiment of FIG. 5 is the second diamond layer 90 covering the top surface 60 of the board 56. Second diamond layer 90 preferably comprises a conformal coat of diamond-like carbon film (DLC). Second diamond layer 90 is preferably formed on board 56 with a low pressure CVD process or and ion sputter process, commercially available from, for example, Diamonex ™ Inc. It will be understood that layer 90 conformally coats the components, wires, traces, and the like which may be disposed on top surface 60 of board 56.

By now it will be appreciated that an electronic circuit assembly with improved heatsinking is provided by the present invention. The use of a diamond layer in the place of conventional metal heatsinks provides heatsinking and an insulating surface simultaneously. Consequently, the need for a ceramic substrate interfacing a heat generating component to a heatsink is eliminated. Furthermore, because diamond conducts heat approximately five times as efficiently as the conventional copper, heat is distributed uniformly throughout the diamond layer in accordance with the present invention. Additionally, where the heat generating electronic component is a semiconductor die, it does not need to be thinned after processing because heat can be dissipated sufficiently with a die having its normal thickness.

We claim:

1. An electronic circuit assembly with improved heatsinking, comprising:
   a component carrying board comprising a first surface, a second surface and at least one opening extending from the first surface to the second surface, the opening receiving an electronic component;
   a first diamond layer disposed adjacent the first surface of the component carrying board, the electronic component attached to the diamond layer through the opening;
   a second diamond layer conformal coat covering the second surface of the component carrying board and a top surface of the electronic component; and
   wherein heat is dissipated from the electronic component to the first diamond layer and the second diamond layer, and distributed through the first diamond layer and the second diamond layer.

2. The assembly of claim 1, wherein a first portion of the first diamond layer extends into the opening.

3. The assembly of claim 1, wherein the electronic component has a top surface and a bottom surface, and wherein the top surface is level with the second surface of the component carrying board and the bottom surface is level with the first surface of the component carrying board.

4. The assembly of claim 1, wherein the electronic component is attached to the first diamond layer with a first solder, and the component carrying board is attached to the first diamond layer with a second solder, the first solder having a higher melting temperature than the second solder.

5. The assembly of claim 1, wherein the first diamond layer comprises amorphous diamond.

6. The assembly of claim 1, further comprising a tungsten layer disposed between the first diamond layer and the component carrying board.

7. The assembly of claim 1, wherein the electronic component is a semiconductor die.

8. An electronic circuit assembly with improved heatsinking, comprising:
   a first diamond layer;
   a metal carbon compound layer covering the first diamond layer;
   a first solder layer comprising a first solder, covering the metal carbon compound layer;
   a component carrying board above the first solder layer, the component carrying board comprising a top surface and a bottom surface and an opening receiving a semiconductor die;
   a second solder layer comprising a second solder covering a bottom surface of the semiconductor die, the semiconductor die attached to the first diamond layer through the opening at a plane defined by the component carrying board bottom surface; and
   a second diamond layer conformal coat covering the component carrying board top surface and the semiconductor die.

9. The assembly of claim 8, wherein the first diamond layer comprises a thin film diamond layer.

10. The assembly of claim 9, wherein the first diamond layer comprises deposited amorphous diamond.

11. The assembly of claim 8, wherein the metal carbon compound comprises tungsten carbide.

12. The assembly of claim 8, wherein the first solder melts at a lower temperature than the second solder.

13. The assembly of claim 8, wherein the second diamond layer comprises a deposited layer of thin film amorphous diamond.

* * * * *